(12) United States Patent
Renard et al.

(10) Patent No.: US 6,260,753 B1
(45) Date of Patent: Jul. 17, 2001

(54) GOLD BUMPS BONDING ON CONNECTION PADS AND SUBSEQUENT COINING OF THEIR VERTEX

(75) Inventors: Loïc Renard, Milan; Battista Vitali, Romano di Lombardia, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/368,560

(22) Filed: Aug. 5, 1999

(30) Foreign Application Priority Data

Aug. 7, 1998 (IT) ............................. VA98A0019

(51) Int. Cl.⁷ ................................... B23K 31/02
(52) U.S. Cl. ................... 228/155; 228/4.5; 228/180.5
(58) Field of Search .................. 228/1.1, 4.5, 110.1, 228/180.5, 155

(56) References Cited

U.S. PATENT DOCUMENTS

| | | | |
|---|---|---|---|
| 4,437,604 | * | 3/1984 | Razon et al. . |
| 4,582,767 |   | 4/1986 | Morioka et al. . |
| 5,401,595 |   | 3/1995 | Kagawa et al. . |
| 5,432,017 |   | 7/1995 | Hassemer et al. . |
| 5,485,949 | * | 1/1996 | Tomura et al. . |
| 5,559,054 | * | 9/1996 | Adamjee . |

FOREIGN PATENT DOCUMENTS

| | | | |
|---|---|---|---|
| 402250328A | * | 10/1990 | (JP) . |
| 05235002A  | * | 9/1993  | (JP) . |
| 05275428A  | * | 10/1993 | (JP) . |
| 06104263A  | * | 4/1994  | (JP) . |
| 09129645A  | * | 5/1997  | (JP) . |

OTHER PUBLICATIONS

Brochure for the KS 1488 Turbo model, released Feb. 27, 1997 by Kuliche and Soffa Industries, Inc.
Data sheet of Aprova Ltd. Of Switzerland, 1992.

* cited by examiner

*Primary Examiner*—Tom Dunn
*Assistant Examiner*—Kiley Stoner
(74) *Attorney, Agent, or Firm*—Theodore E. Galanthay; Allen, Dyer, Doppelt, Milbrath & Gilchrist, P.A.

(57) ABSTRACT

A method for forming and bonding a metal bump on a metal pad of an integrated circuit and successively stamping a vertex of the bonded metal bump is performed using the same capillary tool. The dielectric and refractory tip of the capillary tool ends with a flat surface forming a sharp edge adjacent a concave mouth formed therein. A preformed metal ball held in the concave mouth is bonded to the metal pad of the integrated circuit. The method further includes the step of retracting the capillary tool from the bonded metal bump while allowing free movement of the capillary tool relative to the metal wire passing through an axial conduit of the capillary tool. Relative movement of the metal wire is blocked by clamping the metal wire as soon as the capillary tool is pulled off the bonded metal bump. The capillary tool is then laterally shifted for breaking off the metal wire. The vertex of the bonded metal bump and a residual wire stump is stamped forming a substantially flat and leveled contact area by re-lowering the capillary tool previously misaligned from the bonded metal bump. The wire clamp is released and the capillary tool is lifted and moved to the next metal pad with a portion of the metal wire emerging from the concave mouth.

25 Claims, 2 Drawing Sheets

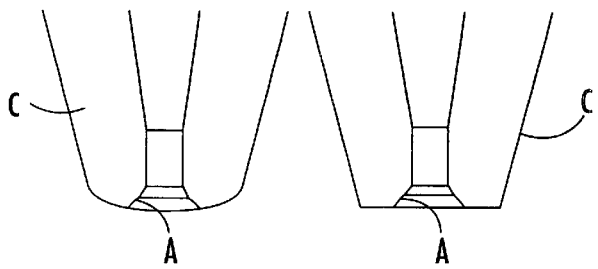
FIG. 1A.
PRIOR ART
FIG. 1B.
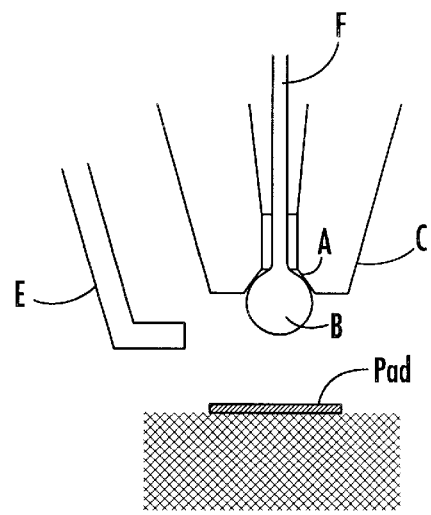
FIG. 2.
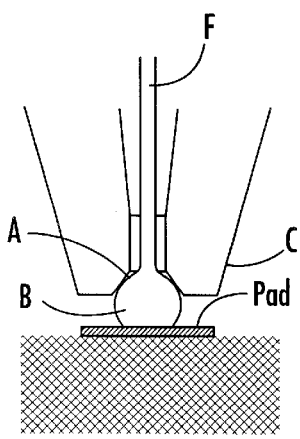
FIG. 3.
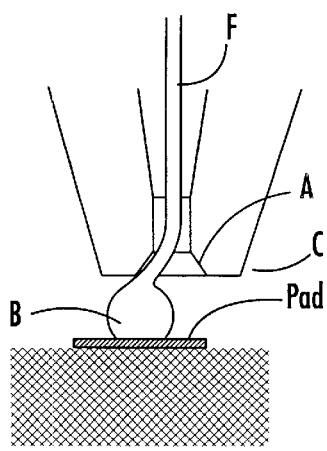
FIG. 4.

GOLD BUMPS BONDING ON CONNECTION PADS AND SUBSEQUENT COINING OF THEIR VERTEX

FIELD OF THE INVENTION

The present invention relates to the fabrication of integrated circuits, and, more particularly, to a method for prearranging external connections of an integrated circuit.

BACKGROUND OF THE INVENTION

A common technique for prearranging an external connection of an integrated circuit is a wire bonding technique. This wire bonding technique includes bonding a wire to each metal pad of the chip of the integrated circuit, and to a respective metal lead defined by die stamping a metal assembly frame of the integrated circuit. The bonding of the wire, which is typically a small diameter gold or aluminum wire, is done by friction welding the wire to the metal surface of the pad while providing vibrating energy to the tool.

Alternative encapsulating techniques have been developed to allow for less delicate and critical ways to make the necessary external connections. A recently developed technique is known as a "flip chip" technique. The flip chip technique is based on the formation of a metal bump or ball on each connecting pad. The bumps are pressure contactable, thus eliminating the need of bonding between the pads and the leads.

For low power devices containing signal processing systems, the metal bumps required on the connection metal pads of the chip may be formed by electrochemical deposition of a suitable metal. For high power devices, the only reliable method to form such bumps on the respective metal pads is to friction weld pre-formed balls of gold, or an equivalent alloy, with a technique similar to the one traditionally used to bond a gold wire.

Suitable tools have been developed to form bumps or balls of gold, and to friction weld respective metal pads to the chip. One such device is a tiny capillary tool with a dielectric tip commonly formed of aluminum, zircon or other refractory oxide. The axial conduit of the capillary tool opens to a flat end face with a tapered mouth at the tip of the tool. The machine is equipped with means to feed a thin wire of gold or alloy through the capillary, and has clamps for functionally blocking the wire intermittently advanced through the capillary tool. A bump is formed by advancing the wire so that it protrudes out a few millimeters from the end face of the tool tip, and by arcing between the wire and a counter-electrode suitably placed in proximity of the tool tip. The arcing is sufficient to melt the metal, which conforms to the concave shape of the mouth of the capillary.

The metal ball created on the tool tip is pressed to the metal pad by lowering the tool over it, and vibrating power is applied to the tool causing the bonding by friction welding the metal ball to the metal pad. Once the bonding is accomplished, the clamp blocks the movement of the wire relative to the capillary, and the tool is pulled away. This breaks off the wire from the bonded metal bump. Thereafter, the tool shifts over a new metal pad. The clamp is released and the wire is advanced a predetermined distance. The clamp closes again and a new electrical arc melts the protruding portion of wire into a new metal ball. This new metal ball is bonded to a corresponding new metal pad.

This process produces bonded metal bumps having a short stump or tiny tail of wire left during the breaking off from the wire. This is caused by retracting the tool while maintaining clamped the feed wire. Commonly, the same machine is equipped with a second tool by which, through a dedicated realigning software, each metal bump after having been bonded to the respective metal pad is stamped. This is done for flattening the short stump of wire left by the breaking-off of the wire, and to produce a plastic flattening of the top of the metal bump. Leveled areas are produced suitable for establishing good electrical contact for assembling the device in a flip chip package.

The bump forming and bonding process, as well as the successive stamping, is done with commercially available machines. One of these machines is described in the brochure for the KS1488 Turbo model, released Feb. 27, 1996, by Kulicke and Soffa Industries, Inc, located in Pennsylvania. Also described in the brochure is the realigning software for stamping the metal bumps after they have been bonded to the metal pads. The tool for forming the metal ball and for bonding it to a metal pad of a chip is a commercially available machine which has a stylus with an axial capillary passage. The tip is primarily made of a dielectric refractory ceramic material with a tapered cavity through which projects the metal wire fed through the capillary.

Commonly, the end face of the tip is a convex surface with a large radius of curvature, and has a concave junction of a relatively large radius connecting with the conical surface of the dielectric tip, as shown in the data sheet of Aprova Ltd. of Lyss, Switzerland, 1992. This is relative to Tip Style CSS, Thermocompression (T/C) or Thermosonic (T/S) Tailless Capillary Bonding tips.

The step of forming and bonding a metal bump to a metal pad using a special capillary tool, and thereafter stamping the metal bump using a different tool, is burdensome in terms of manufacturing times. A number of specific tools are required, including software for realigning a second stamping tool to the same points on which a first tool has been already aligned for forming and bonding the metal bump.

It is evident that there is a need to form and bond a metal bump onto a metal pad, break off the metal wire and stamp the top of a bonded metal bump in an uninterrupted sequence of operations. This is to be done without repeating the alignment of a specific tool to the same metal pad, and without substituting tools.

SUMMARY OF THE INVENTION

A object of the invention is to fulfill the above described requirements by using the same tool throughout the process with straightforward and noncritical modifications to the tool.

By modifying the geometry of the tip of the capillary tool used for forming and bonding the bump, and by programming a modified sequence of movements of the tool, the necessary stamping operation of the top of each metal bump bonded to a respective metal pad is performed. These movements include breaking off the wire from the bonded bump before moving to another metal pad to repeat the process.

The process is completed using as a stamping tool the same ball forming and bonding capillary tool. The dielectric and refractory tip of the capillary is modified to have a substantially flat end surface forming as a sharp edge the conical surface of the tip, and with the surface of the concave mouth of the axial passage through which the metal wire is fed. The sharp edge is formed without any beveling or blunting.

After aligning the capillary tool on a metal pad, forming the metal ball, and bonding by thermosonically friction welding the bump on the pad according to conventional operations, the process may proceed with the following steps. The tool from the bonded bump is lifted while allowing for a free movement of the feed metal wire through the axial conduit of the tool. Movement of any wire relative to the lifted tool is then blocked. The lifted tool is shifted by a distance sufficient to displace the concave mouth of the axial passage off the projection of the bonded bump, thus breaking off the wire from the bonded bump.

The method further includes stamping the bonded bump by lowering the tool onto the bump with sufficient pressure for plastically flattening the top of the bump and the residual wire stump laying radially out and being coplanar to the flattened area of the top of the bump produced by the stamping. This is preferably done by optionally applying a pulse of ultrasonic vibrations at a reduced power with respect to the power used to bond the bump.

The tool is lifted while releasing the clamp that impeded the relative movement of the wire with respect to the tool. The tool is moved above another metal pad with a length of wire emerging from the concave mouth at the center of the end face of its tip. The above process may then be repeated. The process according to the present invention may be carried out using a normal wire-bonder without any specific realigning software. The dielectric and refractory tip of a commercially available capillary tool may be modified to form a substantially flat terminal face. This intersects the conical surface of the tip and the concave surface of the mouth of the feed metal wire with sharp flat edges.

By allowing the wire to move through the capillary tool while lifting the tool after having bonded the bump on the pad, the wire is not broken off from the bonded bump. The wire is broken off upon laterally shifting the lifted tool after having clamped the wire. The breaking of the wire is forced also by the action of the sharp edge of intersection of the concave surface of the mouth and of the flat end face of the tip. The tearing off of the wire leaves a wire stump that is radially oriented.

The lateral shifting of the lifted tool is minimal, and is just sufficient to misalign the projected area of the bump bonded onto the pad of the concave mouth. The lateral displacement may be easily established by programming a second pseudo-bonding operation, optionally with a power input deliberately reduced to a point with at least one coordinate deliberately incremented (or reduced) by an amount equivalent to about the maximum radius of a bonded metal bump. The second pseudo-bonding operation may optionally be at a reduced input power.

The subsequent lowering of the tool onto the top of the metal bump and the eventual application of a vibrational power flattens the top of the bonded bump and the residual wire stump. The input of vibrational power has lower intensity than the power input provided for bonding by friction welding of the metal bump onto the metal pad. The residual wire stamp is bent further in a radial and co-planar position with respect to the flattened surface of the stamped area of the top of the metal bump.

By pulling up the tool with the wire clamp released, the metal wire exits from the concave mouth. When the tool is sufficiently raised and aligned on the next metal pad for forming and bonding a new bump, the above steps are repeated. The small wire residue (stump or tail) remains radially oriented and essentially coplanar to the stamped top surface of the bump, making unnecessary any further intervention before assembling.

BRIEF DESCRIPTION OF THE DRAWINGS

The various aspects, details and advantages of the invention will become even more evident through the following description of an embodiment and by referring to the attached drawings, wherein:

FIGS. 1a and 1b respectively show by way of comparison the tip configuration of a capillary tool for forming bumps according to the prior art, and a modified tip configuration according to the present invention; and FIGS. 2–7 show in sequence the different phases of the process according to the present invention.

DETAILED DESCRIPTION OF THE PREFERRED EMBODIMENTS

The tip profile of a common capillary tool for forming and bonding by friction a metal bump is shown in FIG. 1a, while the tip configuration of a capillary tool modified according to the present invention is shown in FIG. 1b. Still referring to FIG. 1b, the end face of tool tip C is flat and normal to the axis of the stylus, which is different from known tips. A sharp edge is formed along the intersection with the conical surface of the tip and with the concave or generally concave mouth A wherein the metal wire exits.

The main steps of the process of the invention are schematically shown in FIGS. 2–7. FIG. 2 depicts a first step performed upon aligning the capillary tool C of a wire-bonder machine with a metal pad on the face of the device. During this step, an electric arc is induced between the metal wire F protruding by a short length from the mouth A of the end face of the tool C and a counter-electrode E. The electric arc has power sufficient to melt the metal wire F which, by superficial tension and capillarity coagulates in the form of a bump or ball B partly assuming the shape of the concave mouth A.

FIG. 3 depicts the following step of the procedure during which the capillary tool C is lowered against the metal pad where the preformed metal ball B is pressed. By inputting sufficient vibrational (e.g., sonic) and/or thermal power, the bump B is bonded to the metal pad. At this point, which is different from known processes, the capillary tool C is retracted without blocking via a clamp the free movement of the metal wire F inside it. The distance retracted is just sufficient to raise the tip off the bump B.

Figure 5:
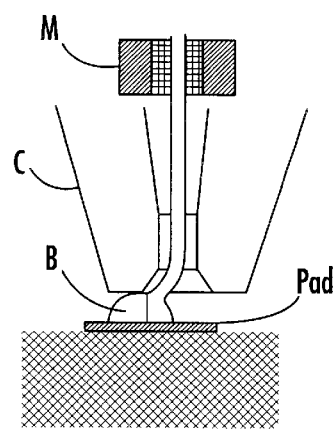

Thereafter, as shown in FIGS. 4 and 5, the wire F is clamped to impede any movement relative to the capillary tool C by the dedicated clamp M located in tool, and the whole tool assembly is shifted horizontally. This causes the bending and eventually the breaking off of the wire F which naturally occurs at the sharp edge between the flat end face of the tool C and the concave surface of the mouth A. As better shown in FIG. 5, the lateral shifting of the tool occurs for a distance that corresponds to about a half the average radius of the metal bump being bonded onto the pad.

Using a common wire bonding machine, this process may be implemented by programming a pseudo second bonding at a point defined by at least one of the two coordinates of the bonding point of the real bump onto the metal pad, and by a second coordinate that is deliberately increased by a distance equal to about the average radius of a bonded bump.

Therefore, by re-lowering the tool C with the wire clamp M blocked, as shown in FIG. 5, the flat portion of the end face of the tool C is pressed against the vertex of the bonded bump B, and by directing a vibrational (e.g., sonic) power lower than that previously used for the bonding operation, the vertex of the bonded bump and the residual wire stump are flattened. This produces a flat and leveled surface with a definite radial orientation of the wire stump coplanar with the leveled surface of the bump.

Figure 6:
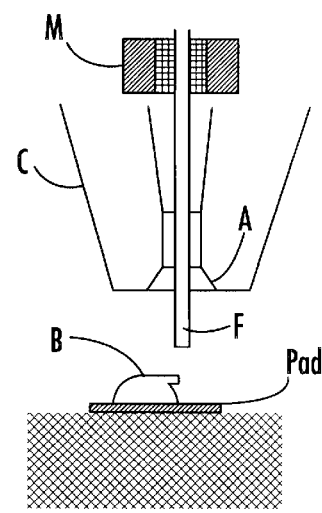
Figure 7:
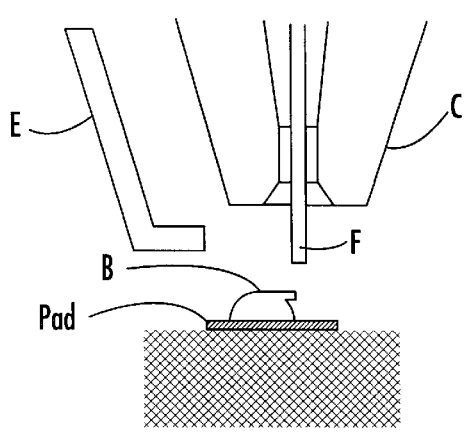

At this point, the clamp M is released and the tool C is fully retracted as shown in FIG. 6. This causes protrusion of a corresponding length of metal wire from mouth A. The tool is then moved over a new metal pad as shown in FIG. 7, and aligned with it, and the entire procedure is repeated by first forming a metal bump by electrical arcing.

The process of the invention was tested using a capillary tool CSS-25-C-1/16-XL from APROVA LTD. The tip has been machined to provide a perfectly flat end face and with sharp edges. The machine used was a wire bonder model 1488 Turbo Plus made by Kulicke and Soffa Industries, Inc. The wire used was a 99.9% gold wire, AFW-6, with a tensile strength between 22–26 g.

The USG vibrational frequency that was applied to the electrode was 60 kHz, and, during the bonding step performed on aluminum pads, the operating conditions were as follows:

| | |
|---|---|
| bonding time: | 25 ms |
| temperature: | 260° C. |
| vibrational power: | 33 mW (nominal) (preferred range 30–35 mW) |
| force applied to tool | 130 g (nominal) (preferred range 120–140 g) |

According to the present invention, the step of stamping the vertex of the gold bumps bonded onto aluminum pads was carried on with the same wire bonder, and with the same tool by changing the force and power applied to the capillary tool as well as the time of application. The results of the tests demonstrated that preferred ranges were:

| | |
|---|---|
| force applied to electrode | 200–400 g |
| time of application | 5–15 ms |
| power | 0–30 mW. |

The results demonstrated that in terms of the average height of the flattened vertex area of the gold bumps, the most determinant parameter is the applied power, followed by the force and the time of application. In contrast, in terms of standard deviation by the height determined on a plurality of bonded bumps realized under the same conditions, the most influencing parameter is the time of application of vibrational power during the stamping.

By leveling uniformity of the different bumps stamped according to the method of the invention, further tests were carried out using the same application time of 15 ms, which has been sufficient to determine a sufficiently low standard deviation of the height. This optimization was conducted by varying the applied power between 5 and 15 mW, and the force applied to the tool between 250 and 350 g. The best results were observed for powers of about 10 mW and with an applied force of about 300 g.

Microscopic observations and SEM photographs confirmed the formation of satisfactory flat and leveled gold bumps, and a substantially radial and coplanar position of the residual metal tail left upon the tearing off of the wire by a substantially lateral pulling action. The standard deviation of the dimensions of the bumps bonded and stamped according to the method of the invention remained between 2.7 and 2.5 μm, while the shear strength of the bonded bumps had a mean value of 194.3 g with a standard deviation of 5.4 g. No cratering on the stamped surface of the bumps subjected to an etch test was observed.

That which is claimed is:

1. A method for forming and bonding a metal bump on a metal pad of an integrated circuit, the method comprising the steps of:

melting into a ball a portion of a metal wire being fed through a conduit of a capillary tool, the portion of the metal wire protruding from a concave mouth of a tip of the capillary tool;

bonding the metal ball being held in the concave mouth to the metal pad of the integrated circuit to form a bonded metal bump;

retracting the capillary tool from the bonded metal bump while allowing free movement of the capillary tool relative to the metal wire passing through the conduit;

blocking relative movement of the metal wire and shifting laterally the capillary tool so as to break off the metal wire; and stamping a vertex of the bonded metal bump and a residual wire stump forming a substantially flat and leveled contact area by re-lowering the capillary tool.

2. A method according to claim 1, wherein the step breaking off the metal wire is performed by shearing the metal wire using a flat surface on an end face of the tip of the capillary tool adjacent the concave mouth.

3. A method according to claim 1, wherein the metal wire comprises 99.9% gold having a tensile strength in a range of about 22 to 26 g/mm$^2$.

4. A method according to claim 1, further comprising the step of unblocking relative movement of the metal wire and lifting the capillary tool.

5. A method according to claim 1, further comprising the step of moving the capillary tool to an adjacent metal pad of the integrated circuit with another portion of the metal wire emerging from the concave mouth.

6. A method according to claim 1, wherein the step of melting comprises providing an electrical arc to the concave mouth.

7. A method according to claim 1, wherein the step of blocking relative movement of the metal wire comprises clamping the metal wire.

8. A method according to claim 1, wherein the step of shifting laterally comprises shifting laterally the capillary tool by a distance greater than about half an average radius of the bonded metal bump.

9. A method according to claim 1, wherein the step of stamping comprises applying a force and inputting a vibrational power for a predetermined time sufficient for bending the vertex of the bonded metal bump and the residual wire stump into a coplanar and radial position with respect to the leveled contact area.

10. A method according to claim 9, wherein the step of applying a force comprises applying the force in a range of about 250 to 350 g; and wherein the predetermined time is greater than about 15 ms.

11. A method according to claim 9, wherein the step of inputting a vibrational power comprises inputting the vibrational power in a range of about 5 to 15 mW; and wherein the predetermined time is greater than about 15 ms.

12. A method for forming and bonding a metal bump on a metal pad of an integrated circuit, the method comprising the steps of:

melting a portion of a metal wire being fed through a conduit of a capillary tool;

bonding the portion of the metal wire to the metal pad of the integrated circuit to form a bonded metal bump;

retracting the capillary tool from the bonded metal bump while allowing free movement of the capillary tool relative to the metal wire passing through the conduit;

blocking relative movement of the metal wire and shifting laterally the capillary tool so as to break off the metal wire; and stamping a vertex of the bonded metal bump and a residual wire stump forming a substantially flat and leveled contact area by re-lowering the capillary tool.

13. A method according to claim 12, wherein the portion of the metal wire protrudes from a concave mouth to an end face of a tip of the capillary tool; and wherein the step of breaking off the metal wire is performed by shearing the metal wire using a flat surface of an end face of the tip of the capillary tool adjacent the concave mouth.

14. A method according to claim 12, wherein the metal wire comprises 99.9% gold having a tensile strength in a range of about 22 to 26 g/mm$^2$.

15. A method according to claim 12, further comprising the step of unblocking relative movement of the metal wire and lifting the capillary tool.

16. A method according to claim 12, wherein the step of melting comprises melting the portion of the metal wire into a ball.

17. A method according to claim 12, further comprising the step of extending the portion of the metal wire from a concave mouth to an end face of a tip of the capillary tool when the metal wire is being fed through the conduit of the capillary tool.

18. A method according to claim 12, further comprising the step of holding the melted portion of the metal wire to be bonded.

19. A method according to claim 12, further comprising the step of moving the capillary tool to an adjacent metal pad of the integrated circuit with another portion of the metal wire emerging from the concave mouth.

20. A method according to claim 12, wherein the step of melting comprises providing an electrical arc to the portion of the metal wire to be bonded.

21. A method according to claim 12, wherein the step of blocking relative movement of the metal wire comprises clamping the metal wire.

22. A method according to claim 12, wherein the step of shifting laterally comprises shifting laterally the capillary tool by a distance greater than about half an average radius of the bonded metal bump.

23. A method according to claim 12, wherein the step of stamping comprises applying a force and inputting a vibrational power for a predetermined time sufficient for bending the vertex of the bonded metal bump and the residual wire stump into a coplanar and radial position with respect to the leveled contact area.

24. A method according to claim 23, wherein the step of applying a force comprises applying the force in a range of about 250 to 350 g; and wherein the predetermined time is greater than about 15 ms.

25. A method according to claim 23, wherein the step of inputting a vibrational power comprises inputting the vibrational power in a range of about 5 to 15 mW; and wherein the predetermined time is greater than about 15 ms.

* * * * *